(12) United States Patent
Gleissner et al.

(10) Patent No.: US 12,680,164 B2
(45) Date of Patent: Jul. 14, 2026

(54) DISTRIBUTION BODY FOR DISTRIBUTING A PROCESS GAS FOR TREATING A SUBSTRATE BY MEANS OF THE PROCESS GAS

(71) Applicant: Lam Research Salzburg GmbH, Salzburg-Gnigl (AT)

(72) Inventors: Andreas Gleissner, Döbriach (AT); Marianne Kolitsch-Mataln, Villach (AT); Harald Okorn-Schmidt, Graz (AT)

(73) Assignee: Lam Research Salzburg GmbH, Salzburg-Gnigl (AT)

( * ) Notice: Subject to any disclaimer, the term of this patent is extended or adjusted under 35 U.S.C. 154(b) by 0 days.

(21) Appl. No.: 18/713,532

(22) PCT Filed: Nov. 7, 2022

(86) PCT No.: PCT/EP2022/080970
§ 371 (c)(1),
(2) Date: May 24, 2024

(87) PCT Pub. No.: WO2023/099125
PCT Pub. Date: Jun. 8, 2023

(65) Prior Publication Data
US 2025/0034709 A1 Jan. 30, 2025

(30) Foreign Application Priority Data
Dec. 3, 2021 (EP) ..................................... 21212361

(51) Int. Cl.
*C23C 16/455* (2006.01)
*C23C 16/458* (2006.01)
(Continued)

(52) U.S. Cl.
CPC .. *C23C 16/45561* (2013.01); *C23C 16/45544* (2013.01); *C23C 16/4584* (2013.01); *C23C 16/481* (2013.01); *C23C 16/52* (2013.01)

(58) Field of Classification Search
None
See application file for complete search history.

(56) References Cited

U.S. PATENT DOCUMENTS 8,062,471 B2 * 11/2011 Mikhaylichenko .......................... H01L 21/67023
219/390
8,282,769 B2 * 10/2012 Iizuka ............... H01J 37/32449
156/345.33
(Continued)

FOREIGN PATENT DOCUMENTS

JP 2003059916 A * 2/2003 ....... C23C 16/45551
JP 3891802 B2 3/2007
(Continued)

OTHER PUBLICATIONS

International Search Report and Written Opinion for International Application No. PCT/EP2022/080970, dated Feb. 17, 2023.
(Continued)

*Primary Examiner* — Sylvia MacArthur
(74) *Attorney, Agent, or Firm* — MARSHALL, GERSTEIN & BORUN LLP

(57) ABSTRACT

The disclosure relates to a distribution body for distributing a process gas relative to a substrate to treat the substrate by means of the process gas, comprising a distribution plate, at least one gas inlet channel, a plurality of gas distribution channels, and a plurality of gas extraction channels, wherein the gas inlet channel extends from a lateral surface of the distribution plate to an interior of the distribution plate, wherein the gas distribution channels branch off from the at least one gas inlet channel and extend to a substrate-facing
(Continued)

surface of the distribution plate to supply process gas to the substrate to be treated, wherein the gas distribution channels are directed essentially perpendicular to the substrate-facing surface, and wherein the gas extraction channels extend from the substrate-facing surface to a another surface of the distribution plate to convey gas away from the substrate. Further, the disclosure relates to a deposition system an a method for distributing a process gas relative to a substrate to treat the substrate by means of the process gas.

13 Claims, 2 Drawing Sheets

(51) Int. Cl.
  *C23C 16/48*      (2006.01)
  *C23C 16/52*      (2006.01)

(56)            References Cited

U.S. PATENT DOCUMENTS

| | | | | |
|---|---|---|---|---|
| 8,440,049 | B2 * | 5/2013 | Zhou | H01L 21/67069 |
| | | | | 118/715 |
| 9,109,754 | B2 | 8/2015 | Yudovsky et al. | |
| 11,018,035 | B2 * | 5/2021 | Amano | H01L 21/67288 |
| 11,408,071 | B2 * | 8/2022 | Son | C23C 16/45565 |
| 2009/0095221 | A1 * | 4/2009 | Tam | C23C 16/45565 |
| | | | | 118/715 |
| 2009/0104351 | A1 | 4/2009 | Kakegawa | |
| 2009/0155488 | A1 | 6/2009 | Nakano et al. | |
| 2009/0246374 | A1 * | 10/2009 | Vukovic | C23C 16/45563 |
| | | | | 427/255.28 |
| 2012/0220109 | A1 | 8/2012 | Komori et al. | |
| 2015/0004793 | A1 | 1/2015 | Dhindsa et al. | |
| 2025/0034709 | A1 * | 1/2025 | Gleissner | C23C 16/545 |

FOREIGN PATENT DOCUMENTS

| | | |
|---|---|---|
| TW | I478771 B | 4/2015 |
| TW | I624560 B | 5/2018 |
| TW | 201819670 A | 6/2018 |
| WO | WO-2011/052463 A1 | 5/2011 |
| WO | WO-2011/056438 A2 | 5/2011 |

OTHER PUBLICATIONS

European Search Report for Application No. 2122361.6, dated May 11, 2022.
Taiwan Office Action for Application No. 111145576, issued Mar. 23, 2026.

* cited by examiner

1

DISTRIBUTION BODY FOR DISTRIBUTING A PROCESS GAS FOR TREATING A SUBSTRATE BY MEANS OF THE PROCESS GAS

CROSS-REFERENCE TO RELATED APPLICATIONS

This present application is the US national phase of International Patent Application No. PCT/EP2022/080970, filed Nov. 7, 2022, which claims priority to European Application No. 21212361.6, filed Dec. 3, 2021. These applications are hereby incorporated by reference in their entireties.

TECHNICAL FIELD

The disclosure relates to a distribution body for distributing a process gas relative to a substrate to treat the substrate by means of the process gas, a deposition system for treating a substrate by a process gas, a method for distributing a process gas relative to a substrate to treat the substrate by means of the process gas, and a use of the distribution body to treat a substrate by means of a process gas.

BACKGROUND

Many industrial processes for treating a substrate require a highly uniform, effective and/or controllable supply of a gas phase to a surface of the substrate. Such processes include, e.g. film forming processes, film or substrate doping processes, annealing processes, ashing processes as well as heating and cooling of the substrate etc. The quality of the results of those processes depends on the uniformity of a gas supply to the substrate surface, the uniformity of a temperature control, and/or the uniformity and/or efficiency of a removal of process and/or reaction products.

In the prior art, so-called shower heads are usually used in those processes to supply gases, which can provide a uniform supply of gas reactants, but are limited in temperature control and, particularly, with regard to uniformity and/or efficiency of the removal of process and/or reaction products. In addition to the use of the gas stream for heating, additional heating means can be used e.g., chuck-heating means, which are in contact with the substrate or radiation type heating means, which are not in physical contact with the substrate.

SUMMARY DISCLOSURE

Hence, there may be a need to provide an improved distribution body for distributing a process gas relative to a substrate to treat the substrate by means of the process gas, which allows improving the processing of a substrate by means of a process gas, particularly with regard to uniformity and/or efficiency of the removal of process products, e.g. cooled down gas, heated up gas, or the removal of chemical reaction products.

This problem is solved by the subject-matters of the independent claims, wherein further embodiments are incorporated in the dependent claims. It should be noted that the aspects of the invention described in the following apply also to a distribution body for distributing a process gas relative to a substrate to treat the substrate by means of the process gas, a deposition system for treating a substrate by a process gas, a method for distributing a process gas relative to a substrate to treat the substrate by means of the process gas, and a use of the distribution body to treat the substrate by means of the process gas.

According to the present disclosure, a distribution body for distributing a process gas relative to a substrate to treat the substrate by means of the process gas is presented. The distribution body comprises a distribution plate, at least one gas inlet channel, a plurality of gas distribution channels, and a plurality of gas extraction channels. The gas inlet channel extends from a lateral surface of the distribution plate to an interior of the distribution plate. The gas distribution channels branch off from the at least one gas inlet channel and extend to a substrate-facing surface of the distribution plate to supply process gas to the substrate to be treated, wherein the gas distribution channels are directed essentially perpendicular to the substrate-facing surface. The gas extraction channels extend from the substrate-facing surface to another surface of the distribution plate to convey gas away from the substrate.

The distribution body may allow achieving a highly uniform supply of gas to the substrate surface to be treated, and/or a highly uniform and local extraction of the used gas and/or reaction products. In particular, the gas distribution channels may be provided separately from the gas extraction channels, allowing a gas removal through the gas extraction channels simultaneously to a gas supply through the gas distribution channels.

In particular, the uniform and efficient supply of gas or gases to the substrate surface to be treated may be achieved by providing a plurality of individual gas distribution channels. Further, a design and operation of the gas distribution channels may enable controlling an impact speed of the gases onto the substrate surface to be treated.

In particular, the uniform and efficient supply of gas or gases to the substrate surface to be treated may be further improved by providing a flow control array arranged upstream of the gas distribution channels with respect to a flow of the process gas and comprises several control elements. The flow control array may allow that a turbulent flow of the gas or gases, and particularly only turbulent flow of the gas or gases, arrives at each individual gas distribution channel. The number of gas extraction channels may be at least equal to the number of gas distribution channels. Further, the gas extraction channels, and the gas distribution channels may be distributed equally over the substrate-facing surface of the distribution plate, allowing an efficient and local supply of the process gas as well as an efficient and local removal of the used gas and/or process products, particularly gaseous reaction products above the substrate surface to be treated.

The other surface of the distribution plate may be a lateral surface of a backside surface, the latter being essentially opposite to the substrate-facing surface.

In other words, the distribution body may enable an ultra-local evacuation or removal of used gases, a mixing of the used gases, particularly from a center of the substrate, with freshly incoming gases through the gas distribution channels can be prevented. In such way, the distribution body may be highly scalable, particularly to exceptionally large substrate geometries.

In an embodiment, a summation of the cross sections of all openings of the gas distribution channels in the substrate-facing surface may be essentially equal to or smaller than a summation of the cross sections of all openings of the gas extraction channels in the substrate-facing surface.

Thus, the ratio of the gas extraction channels to the gas distribution channels may be specifically tailored to a gas flow on the surface. This means, that a total gas extraction flow for removing the used gas and/or gaseous reaction products from the substrate surface to be treated may be larger than a total gas distribution flow for supplying fresh gas to the substrate surface to be treated, because the volume and/or amount of used gas and/or gaseous reaction products may be larger than a volume or amount of the supplied fresh gas. Thus, such ratio may prevent an undesired tailback of used gas and/or gaseous reaction products on or near the substrate surface to be treated, thereby preventing the occurrence of undesired flow-interferences on or near the substrate surface to be treated.

In particular, the openings of the gas distribution channels may be non-directional, thus may be porous, like a sponge. Such porous design for the openings of the gas distribution channels may allow avoiding a much focused gas flow, a so-called jet, to the surface of the substrate to be treated.

The openings of the gas distribution channels may have a diameter larger than a diameter of the openings of the gas extraction channels, but in total, the sum of the cross sections of all openings of the gas distribution channels in the substrate-facing surface may be essentially equal to or smaller than the sum of the cross sections of all openings of the gas extraction channels, e.g. by providing more gas extraction channels than gas distribution channels.

In an embodiment, a single opening of a gas distribution channel in the substrate-facing surface may be surrounded by several openings of gas extraction channels arranged on an imaginary circular line around the opening of the gas distribution channel as imaginary circle centre.

For example, the single opening of a gas distribution channel may be surrounded by at least two, or more, slit-like openings of the gas extraction channels, e.g. half-moon-shaped openings. Such arrangement may allow forming a local gas circuit, or a so-called gas cell, enabling supplying fresh gas through the single opening of a gas distribution channel and locally evacuating the used gas and/or the gaseous reaction products through the openings of the gas extractions channels surrounding the single opening of a gas distribution channel. In this embodiment, openings of the gas distribution channels may have a diameter larger than the openings of the gas extraction channels. With this arrangement, a higher volume of gas may be provided to the substrate, whereas the gas extraction openings surrounding the single gas distribution opening may extract the gas in smaller amounts, yet completely because of the higher number of gas extraction channels. This would, in other words, distribute the amount of gas to be extracted to multiple gas extraction holes, increasing efficiency in gas extraction without overloading the distribution body. Additionally, the sum of the cross sections of all openings of the gas distribution channels in the substrate-facing surface may be essentially equal to or smaller than the sum of the cross sections of all openings of the gas extraction channels. Thereby, flow interferences due to a flow of the used gas along the substrate surface may be avoided.

Further, such gas cell, which may include supplying gas to the substrate through a single opening of a gas distribution channel and extracting gas from the substrate through the several opening of gas extraction channels surrounding the single opening of a gas distribution channel, may allow controlling a concentration of gas very accurately, thereby enabling to provide a gas flow having a substantially constant concentration.

In an embodiment, openings of the gas distribution channels and openings of the gas extraction channels may be arranged on imaginary spiral curved lines around an imaginary center. Alternatively, gas distribution and/or gas extraction may be conducted via the openings of the gas distribution channels and/or gas extraction channels, which are arranged on a spiral pattern (although there can be multiple spirals), whereas the openings other than the spirally arranged opening may not be used for gas distribution or gas extraction. Accordingly, the openings may be arranged arbitrarily, but only the openings on the spiral pattern may be used for gas distribution or gas extraction. In this embodiment, separate control of each or groups of openings is accordingly provided. This is particularly advantageous, because an already existing distribution plate with gas distribution or extraction openings in any arrangement may be used by selectively activating openings in a particular pattern according to the substrate to be treated. Thereby, a flexible distribution body may be provided.

An arrangement on imaginary spiral curved lines may allow arranging the opening of the gas distribution channels and the openings of the gas extraction channels with a substantially constant space to each other, particularly on a substantially round distribution plate. In other words, the spiral-shaped arrangement may prevent intervals between the openings of the gas distribution channels and/or the openings of the gas extraction channels from becoming too large, whereby the spiral-shaped arrangement may improve the in-plane uniformity of the gas supply on the substrate surface to be treated.

In an embodiment, the distribution body may further comprise at least one radiation unit arranged at the substrate-facing surface of the distribution plate to radiate the substrate to be treated.

The at least one radiation unit may allow providing radiation to the substrate e.g., for creating a thermal response of the substrate, thereby enabling a fast and highly uniform heating of the substrate. The at least one radiation source may also be chosen for creating another physical or chemical response at the substrate e.g., a photo chemical reaction or a physical creation of minority carriers. Additionally, or alternatively, the at least one radiation unit may be arranged on a surface of the distribution body facing the substrate on the opposite side of the substrate surface to be treated.

In an embodiment, the radiation unit may comprise at least one LED (light emitting diode) arranged between an opening of the gas distribution channels and an opening of the gas extraction channels. The at least one LED may provide radiation to the substrate thereby enabling a fast and/or uniform heating of the substrate. An LED may be a cost-effective radiation unit. In particular, the at least one LED may be of a specific wavelength, wherein the wavelength may be chosen dependent on an absorption edge of the medium and/or substrate to be heated. In case, more than one medium, particularly more than one gaseous medium, is used in addition to the substrate, the LEDs may be required to provide a larger wavelength-range. Additionally, or alternatively, the wavelength of at least one LED may be chosen dependent on an absorption edge of the medium and/or the substrate to be exited to support chemical or physical reactions.

In another embodiment, the LED may have a tunable spectrum to provide radiation of different wavelengths and/or wherein, in case of several LEDs, the LEDs may have different wavelengths. In particular, the LED may be tunable in a predefined wavelength-range, thereby allowing alternatingly heating the substrate and the medium, in case both have an absorption edge of significantly different wavelengths. In case of several LEDs, the LEDs may be tunable individually to provide the required wavelength range, or each of the several LEDs may be of a predefined specific wavelength, wherein the LEDs may be turned on and/or off individually to provide the required wavelength range. In other words, a turn on/off cycle may be varied for each LED individually. Instead of using on/off cycles, also a power supply regulation can be applied to modify the amount of radiation being transmitted and/or to change the color temperature impacting the substrate and/or the medium. In other words, the power supply regulation may be used for controlling the LEDs having a tunable spectrum, and/or the power supply regulation may be used for activating and deactivating each of the several LEDs individually or all together or several LEDs in groups of more than one.

In an embodiment, in case of several LEDs, the LEDs may be arranged on imaginary spiral curved lines around an imaginary centre. Thereby, a heating uniformity per unit of area on the substrate may be improved. Alternatively, the LEDs may be arranged arbitrarily on the radiation unit, but only the LEDs on the spiral pattern may be turned on. In this embodiment, separate control of each or groups of LEDs is accordingly provided. This is particularly advantageous, because an already existing radiation unit with LEDs in any arrangement may be used by selectively turning on LEDs in a particular pattern according to the substrate to be radiated. Thereby, a flexible distribution body may be provided.

In an embodiment, the distribution body may further comprise a temperature control unit to heat or cool the gas and/or the substrate. In particular, the temperature control unit may comprise a Peltier element configured to heat and/or cool the substrate.

According to the present disclosure, also a deposition system for treating a substrate by a process gas is presented. The deposition system comprises a distribution body as described above, and a substrate holder. The substrate holder is configured to hold the substrate to be treated.

The distribution body may allow achieving a highly uniform supply of gas to the substrate surface to be treated, and/or a highly uniform and local extraction of the used gas and/or reaction products. In particular, the gas distribution channels may be provided separately from the gas extraction channels, allowing a gas removal through the gas extraction channels simultaneously to a gas supply through the gas distribution channels.

The substrate holder may allow positioning the substrate accurately relative to the distribution body, thereby improving the process accuracy.

In an embodiment, the deposition system may further comprise a substrate agitation unit, wherein the substrate agitation unit may be configured to agitate and/or rotate the substrate holder relative to the distribution body. Agitating and/or rotating the substrate may further improve a uniformity of gas impingement on the substrate surface to be treated and/or may enable a uniform heating and/or temperature control of the substrate.

In an embodiment, the deposition system may further comprise a gas cycle unit, wherein the gas cycle unit may be connected to the gas extraction channels and the at least one gas inlet channel of the distribution body. In an embodiment, the deposition system may further comprise a gas reconditioning system to provide the substrate with a gas flow of constant or controlled-varying composition or constant or controlled-varying temperature.

In another embodiment, the deposition system may further comprise means to adjust a pressure in a processing space between the distribution body and the substrate from 0.1 Torr to at least 900 Torr. In particular, the ability to adjust the pressure in the processing space is provided additionally to the ability of adjusting the gas flow, gas mix and gas concentration. Adjusting the pressure in the processing space allows improving, and particularly optimizing the deposition process with regard to deposition growth rate, deposition quality, e.g. crystalline or amorphous, and/or deposition uniformity. In such a system, the gas inlet channels and the gas extraction channels may be the only openings into the processing space in order to provide for an efficient local exchange of incoming gases and process and/or reaction products.

The gas cycle unit may allow supplying, e.g. jetting, the gas on the substrate surface to be treated through the gas distribution channels, returning the gas to the other surface of the distribution plate, e.g. the backside of the distribution plate through the gas extraction channels, and returning the gas to the gas distribution channels. Furthermore, the gas cycle unit may allow controlling a gas circulation around the substrate and/or the distribution body (such as a circumference of the distribution body) for a targeted gas extraction. Thus, the gas cycle unit may allow significantly reducing the amount of gas consumption for the process.

Further, the gas reconditioning system may be included in the gas cycle unit, particularly such that, the gas which is extracted from the substrate surface to be treated by the gas extraction channels, may be filtered or cleaned, and/or re-prepared by the reconditioning system before the gas may be returned to the gas distribution channels.

Thus, the deposition system may enable working with gases having a higher thermal conductivity compared to nitrogen or air, e.g., hydrogen or helium. Gases with a higher thermal conductivity may provide an accelerated cooling down time and thus, an increased substrate throughput during manufacturing process sequences, but may usually be too expensive to be used in such a process, because a large amount of such gas would be needed. Due to the cycle unit and/or the reconditioning system, the gases may be effectively recycled, re-conditioned and/or re-used, which may significantly reduce costs for the high thermal conductivity gases.

According to the present disclosure, also a method for distributing a process gas relative to a substrate to treat the substrate by means of the process gas is presented. The method comprises the following steps, not necessarily in the presented order:

providing a distribution body as described above,
    providing a substrate relative to the distribution body,
    supplying a process gas to the substrate via at least one
      gas inlet channel and a plurality of gas distribution
      channels of the distribution body, and
    conveying a gas from the substrate via gas extraction
      channels of the distribution body.

The method may allow achieving a highly uniform supply of gas to the substrate surface to be treated, and/or a highly uniform and local extraction of the used gas and/or reaction products. In particular, the gas distribution channels may be provided separately from the gas extraction channels, allowing a gas removal through the gas extraction channels simultaneously to a gas supply through the gas distribution channels.

In particular, the uniform and efficient supply of gas or gases to the substrate surface to be treated may be achieved by providing a plurality of individual gas distribution channels.

Further, a design and operation of the gas distribution channels may enable controlling an impact speed of the gases onto the substrate surface to be treated.

The number of gas extraction channels may be at least equal to the number of gas distribution channels. Further, the gas extraction channels and the gas distribution channel may be distributed equally over the substrate-facing surface of the distribution plate, allowing an efficient and local supply of the process gas as well as an efficient and local removal of the used gas and/or reaction products, particularly gaseous reaction products above the substrate surface to be treated.

In an embodiment, the method may further comprise providing a cooling or heating gas via the at least one gas inlet channel and the plurality of gas distribution channels. This may allow using the gas inlet channel and the plurality of gas distribution channels for providing both, a cooling and a heating gas, thereby enabling a very compact design of the distribution body. Further, the process may allow being performed significantly faster, with an improved uniform and with a reduced gas consumption. Additionally, or alternatively, the distribution body may be actively heated or cooled to the same or similar temperature as the process gases, thereby allowing improving process performance and/or process speed.

According to the present disclosure, also a use of the distribution body as described above to treat a substrate by means of a process gas in a film forming, doping, ashing, annealing, heating and/or cooling process is presented.

In a film forming process, for example chemical vapour deposition (CVD) atomic layer deposition (ALD) etc., a gas or multiple gases are supplied to a substrate, particularly to a heated substrate. On the substrate, through chemical reactions, a film of a predetermine composition, thickness and/or uniformity is growing on the surface to be treated. Using the distribution body for such a film forming process may improve particularly the uniformity of the grown film.

In a film or substrate doping process, for example, dopant diffusion process, so-called dopants, which are specific gases, e.g. phosphorous, boron, arsenic, etc., are supplied to a substantially commonly heated surface of the film or substrate to change the material properties of the film or substrate. Using the distribution body in such a film or substrate doping process may allow increasing the uniformity of heating the surface, and/or may allow improving the uniformity of supplying the dopants over the surface.

In an ashing process, e.g., oxidative gases are supplied to a surface of the substrate having a mainly organic material on top, like photo resist, e.g., as used for microelectronic fabrication. By using the oxidative gas, e.g. ozone gas, combined with heat, the photo resist can be decomposed into gas phase reaction products allowing at least reducing or even eliminating, the wet chemical decomposition or etching the material from the surface. Using the distribution body in such ashing process may allow increasing the uniformity of heating the surface, and/or may allow improving the uniformity of supplying the oxidative gases over the surface, resulting in a highly uniform decomposition of the oxidative gases.

For example, in a photo-resist-ashing process, a substrate may be supplied below or above the distribution body, wherein the surface to be processed faces the substrate-facing surface of the distribution plate. In a first step, the gas distribution channels supply or jet an active gas, e.g. ozone, to the surface with a high uniformity. Unreacted gas and/or gaseous reaction products, e.g. carbon dioxide, is locally returned by the gas extraction channels to a backside of the distribution body. The returned gas can be re-prepared, e.g. filtered, and then returned to the gas distribution channels, thereby significantly reducing an amount of gas required for the process. In a next step, the LEDs as an exemplary radiation source, are turned on, wherein the radiation wavelength of the LEDs is adjusted to be absorbed by the substrate to create thermal energy within the substrate. Alternatively, the wavelength of the radiation source may also be chosen to be absorbed by the photo resist and/or the reaction gas.

Afterwards, when the desired amount of photo resist has been removed, the LEDs are turned off, and eventually a cooling gas, e.g. nitrogen, is turned on and supplied to the surface to be treated by the gas distribution channels, thereby achieving a highly effective cooling. The cooling gas is removed locally through the gas extraction channels and may be prepared for being reused again, e.g. by being cooled down and then filtered or by being cooled down while being filtered. In specific cases, at least a second separate gas extraction channel may be provided, which are not located directly opposite of the substrate. In another, more specific example, a gap between the distribution body and the substrate may be at least partly filled with a liquid chemistry, e.g. water, an acid, a base, a solvent etc., for the reactive gas to be more efficient in removing the photo resist and to avoid defects being difficult to remove by preventing photo resist popping.

In an annealing process, specific reactive gas phases are brought in contact with a pre-treated substrate to form a new phase, molecular combination, or a new material on or within the substrate. For example, ammonia gas annealing processes are performed to form nitrides of Ga, Si, Ti, and/or many other industrially important materials. One type of annealing process may be surface oxidation processes, during which oxidative gases, e.g., ozone, are supplied to the surface to from passivated or activated surfaces, depending on the substrate material, the process temperature, and other parameters. Another example may be hydrogen-gas annealing processes, which may be used for certain metals and/or semiconducting interfaces to passivate electrical active or defective sites. A further example may be inert annealing process, in which inert gases are supplied to the substrate surface, e.g. to densify the material on the surface.

For all types of annealing processes, using the distribution body may improve the uniformity of the desired surface, and/or may reduce the overall required amount of the respective gas to perform the respective process.

One example for an annealing process may be needed with regard to copper as an electrochemical plating material. Copper has to undergo a temperature annealing cycle after chemical deposition to speed up the formation of a stable crystalline form. Therefore, the substrate with the deposited copper has to be heated to a temperature between 200° C. and 500° C. and then cooled down to room temperature again. Additionally, such process needs to be performed fast for productivity purposes. Thus, the distribution body combined with a heating system, e.g. the deposition system including the LEDs as radiation source, may allow achieving the required performing speed of the process. According to this example, the substrate can be loaded into a processing chamber underneath or above the deposition system, wherein the substrate surface to be processed faces the substrate-facing surface of the distribution plate. The process may be performed as follows:

At first, an inert gas, e.g. nitrogen gas, is jetted by the gas distribution channels to the surface with high uniformity and returned to the backside of the distribution plate locally through the gas extraction channels. Furthermore, the returned gas can be re-prepared, e.g. filtered, and then returned to the gas distribution channels, allowing significantly reducing the amount of gas required for the process. Then, LEDs are turned on, wherein the radiation wavelength is adjusted to be absorbed by the substrate to create thermal energy within the substrate.

After a predefined temperature of the substrate is reached, the temperature is maintained for a predetermined time. The temperature may be controlled by a temperature sensor being provided at the substrate. At anneal time finish, the LEDs are turned off and a cooling gas, e.g. nitrogen, is turned on and supplied to the substrate surface to be processed by the gas distribution channels, thereby achieving a highly effective cooling. The cooling gas is removed from the substrate very locally through the gas extraction channels and prepared for reuse again, e.g. by being cooled down and then filtered, or by being cooled down while being filtered. The nitrogen gas used as cooling gas may be of the same of different, particularly lower temperature that the nitrogen gas used as the annealing gas.

Such process allows performing the copper annealing process significantly faster, more uniform and with a reduced gas consumption.

Further, the distribution system allows performing a reactive gas annealing process with fresh reactive gas being supplied to every radial position on the substrate and reacted gas products are removed or exhausted ultra-locally through the gas distribution channels, thereby eliminating the interference of the reaction products with fresh reactive gas streams provided through the gas distribution channels on neighboring parts of the substrate surface. In particular, reaction products in the center of the substrate are prevented from moving across towards the outer edge of the substrate before being removed. Thus, interference with all other part, creating defects, non-uniformities and/or unwanted side-reaction can be reliably prevented. A heating and/or cooling of the substrate may be achieved individually by transmitting heating energy through the gas flow, through radiation sources, like LEDs, and/or Peltier elements, wherein each if which may provide a contribution to achieve an optimum performance.

In a heating process, the distribution body may allow supplying a pre-heated gas flow to the surface of the substrate, thereby mildly heating the substrate to a predefined temperature. In a cooling process, the distribution body may allow cooling the substrate by providing a cooling gas uniformly to the surface of the substrate, thereby extracting excess heat from the material. It shall be understood that the system, the device, and the method according to the independent claims have similar and/or identical preferred embodiments, in particular, as defined in the dependent claims. It shall be understood further that a preferred embodiment of the disclosure can also be any combination of the dependent claims with the respective independent claim.

These and other aspects of the present disclosure will become apparent from and be elucidated with reference to the embodiments described hereinafter.

BRIEF DESCRIPTION OF THE DRAWINGS

Exemplary embodiments of the invention will be described in the following with reference to the accompanying drawing.

DETAILED DESCRIPTION OF EMBODIMENTS

Figure 1A:
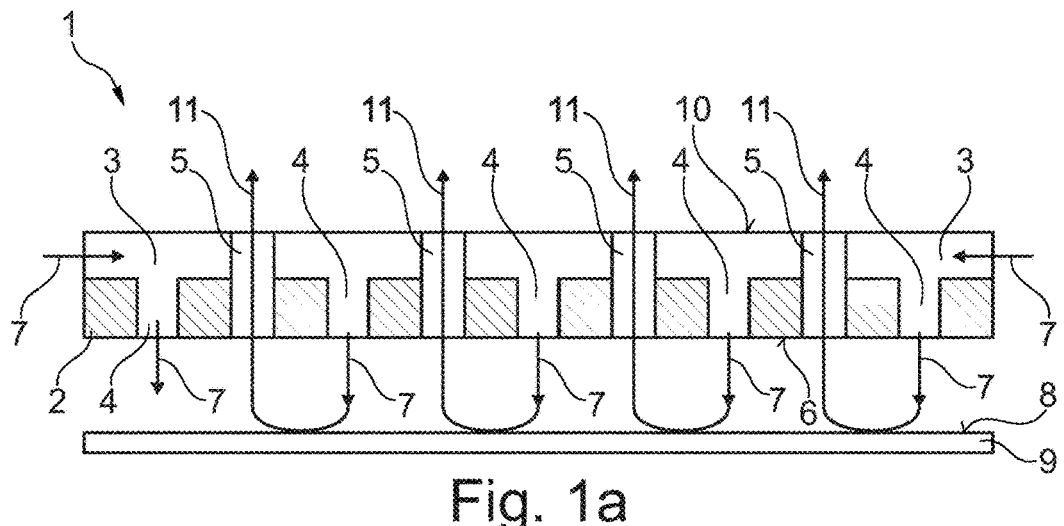
FIG. 1a shows schematically and exemplarily a cross-section of a distribution body according to the disclosure.

FIG. 1a shows schematically and exemplarily a cross-sectional view of an embodiment of a distribution body 1 comprising a distribution plate 2 and two gas inlet channels 3, which branches into five gas distribution channels 4. Further, the distribution body 1 comprises four gas extraction channels 5, which are alternatingly arranged with the gas distribution channels 4. The gas inlet channels 3 extend in a lateral direction trough an interior of the distribution plate 2, and the gas distribution channel 4 branch off from the two gas inlet channels 3 and extend substantially perpendicular to a substrate-facing surface 6 of the distribution plate 2 to supply a gas flow of a process gas 7 towards a surface 8 of a substrate 9, such that the process gas 7 may impinge the surface 8 substantially perpendicular. The process gas 7 is configured to react with the surface 8 of the substrate 9.

Figure 1B:
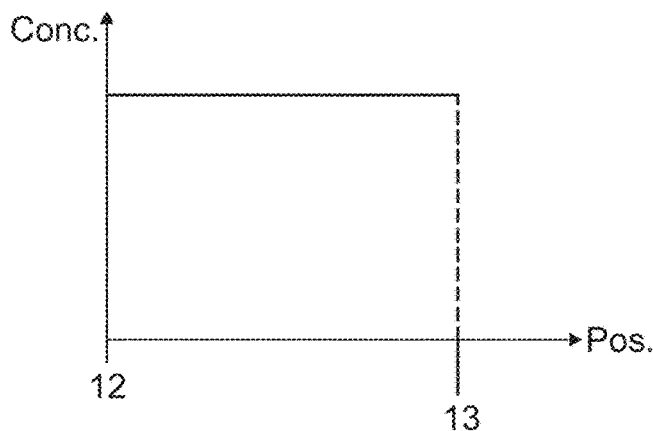
FIG. 1b shows schematically and exemplarily a graph illustrating a concentration curve relative to a position on the substrate surface.

The gas extraction channels 5 extend from the substrate-facing surface 6 of the distribution body 2 to a backside surface 10 of the distribution plate 2 and are configured to remove a used gas 11 including gaseous reaction products from the surface 8 of the substrate 9. As shown in FIG. 1a, the gas extraction channels 5 are arranged adjacent to at least one gas distribution channel 4, thereby allowing removing the used gas 11 locally from the surface 8 of the substrate 9. This allows providing a substantially constant concentration of the process gas 7 over the entire surface 8 of the substrate 9, particularly from a center 12 of the substrate 9 to an outer edge 13 of the substrate 9, as shown in FIG. 1b. The substantially constant concentration enables improving a uniformity of the reaction product of the surface 8 and the process gas 7, e.g. the uniformity of a thickness of a film grown by a reaction of the process gas 7 and the surface 8 of the substrate 9.

Figure 2:
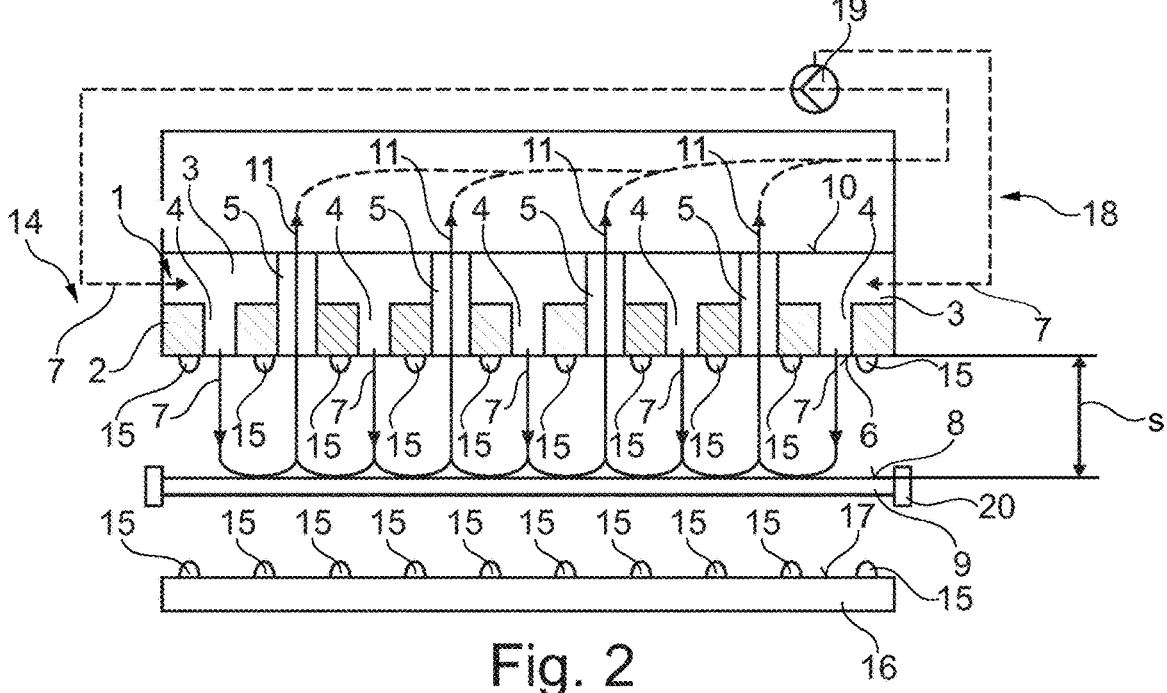
FIG. 2 shows schematically and exemplarily a deposition system according to the disclosure.

FIG. 2 shows schematically and exemplarily a cross-sectional view of an embodiment of a deposition system 14. The deposition system 14 comprises the distribution body 1 as exemplarily shown in FIG. 1, further comprising several LEDs 15, which are arranged inbetween the gas distribution channels 4 and the gas extraction channels 5. The LEDs 15 are configured to provide radiation to the substrate 9, mainly to create a thermal response of the substrate 9, thereby enabling a fast and highly uniform heating of the substrate 9. The deposition system 14 further comprises a plate 16 being arranged on an opposite site of the substrate 9. The plate 16 has a substrate-facing surface 17, on which additional LEDs 15 are arranged. In another embodiment, the LEDs 15 may be provided either on the substrate-facing surface 6 of the distribution body 1 or on the substrate-facing surface 17 of the plate 16. In yet another embodiment, no LEDs 15 may be provided.

Further, according to the embodiment shown in FIG. 2, the distribution body 1 is coupled to a gas cycle unit 18 comprising a gas reconditioning system 19. The gas cycle unit 18 is configured to return gas coming from the gas extraction channels 5 to the gas inlets 3. The gas reconditioning system 19 is configured to re-prepare, e.g. filter, clean, purify, re-heat, and/or re-cool the gas returning from the gas extractions channels 5, such that a gas provided at the gas inlets 3 corresponds to a substantially fresh process gas 7.

The substrate 9 is held by a substrate holder 20, which may further allow agitating and/or rotating the substrate 9 relative to the distribution body 1, e.g. by being coupled to an agitating and/or rotating unit. This may result in a further improved uniformity of gas impingement and/or a uniform heating and temperature control of the substrate 9.

Further, the substrate 9 and the distribution body 1, particularly the substrate-facing surface 6 of the distribution body, are arranged spaced apart from each other, thus forming a processing space s between themselves. Within this processing space s, the process gas 7 exits the distribution body 1 through the gas distribution channels 4 towards the surface 8 of the substrate 9, and the used gas 11 resulting from the process gas 7 reacting with the surface 8 of the substrate 9, enter the distribution body 1 through the gas extraction channels 5. By pressurizing the processing space s with a pressure from at least 0.1 Torr to at least 900 Torr, the deposition process can be further modified and improved, and particularly optimized, with regard to the deposition speed, deposition quality, e.g. crystalline or amorphous deposition, and/or deposition uniformity. For example, in case the pressure exceeds a predetermined upper threshold, the deposition process may be performed too quick resulting in an uneven material deposition, or even in material defects. As a particular example, for achieving crystalline depositions, a so-called epitaxial growth, the material deposition has to be performed very slowly, which can be achieved in an environment with a large underpressure. The pressure may be applied and/or adjusted by means (not illustrated), particularly pressurizing means, such as a vacuum or gas suction system at the backside of the distribution body, and in particular at the ends of gas extraction channels. Those systems may be comprised in the deposition system 14, and reduce the pressure inside the processing space s when, at the same time, the gas stream through the gas distribution channels is also reduced. For example, the pressure in the processing space s may be established by increasing the gas pressure through the gas distribution channels and at the same time limiting the exit flow of the gas through the gas extraction channels.

Figure 3:
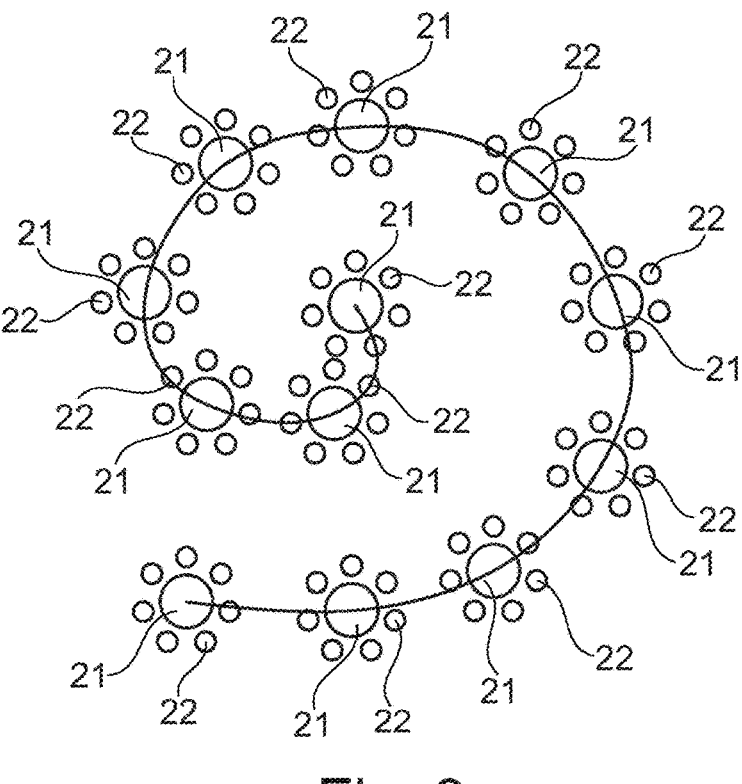
FIG. 3 shows schematically and exemplarily a partial view of a distribution plate according to the disclosure illustrating a spiral arrangement of openings of gas distribution channels and gas extraction channels.

FIG. 3 shows schematically and exemplarily a spiral arrangement of the gas distribution channels 4 and the gas extraction channels 5 in a partial bottom view. Further, in FIG. 3 each opening 21 of a gas distribution channel 4 is surrounded by seven openings 22 of gas extraction channels 5. Providing a plurality of openings 21 of gas distribution channels 4, particularly substantially equally arranged over the entire distribution plate 2 allows a very uniform and efficient supply of the process gas 7 to the surface 8 of the substrate 9. Providing several openings 22 of gas extraction channels 5 surrounding one opening 21 of a gas distribution channel 4 enables improving the local removal of the used gas 11 including gaseous reaction products above the surface 8 of the substrate 9. Further, as shown in FIG. 3, a diameter of the openings 21 is larger than a diameter of the openings 22, but in total, the summation of all cross-sections of the openings 21 is equal to or smaller than the summation of all cross-section of the opening 22.

Figure 4:
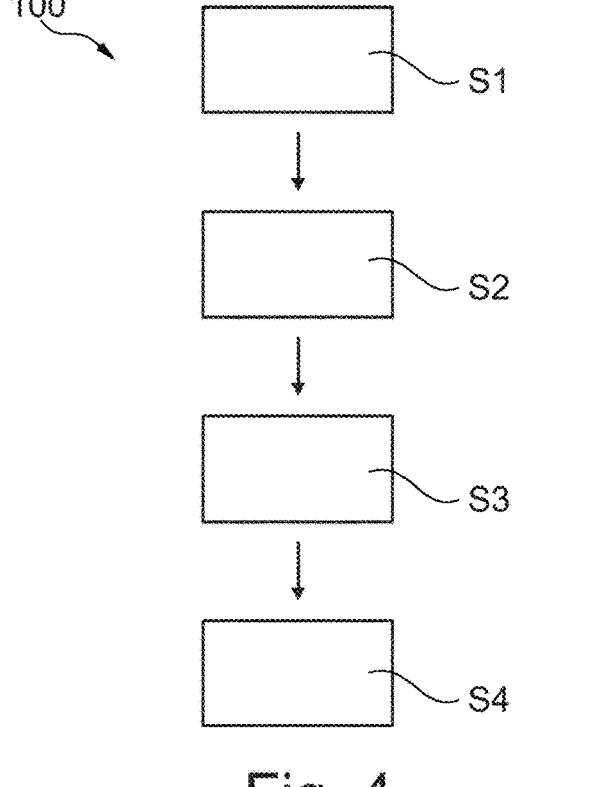
FIG. 4 shows schematically and exemplarily a flow diagram of a method according to the disclosure.

FIG. 4 shows a flow diagram of an exemplary method 100 for distributing a process gas 7 relative to the substrate 9 to treat the substrate 9 by means of the process gas 7. according to the method 100, in a step S1, there is provided a distribution body 1 as described above. In a step S2, there is provided the substrate 9 relative to the distribution body 1. In a step S3, the process gas 7 is supplied to the substrate 9 via at least one gas inlet channel 3 and a plurality of gas distribution channels 4 of the distribution body 1. In a step S4, a gas, particularly the used gas 11, is conveyed from the substrate 9 via the gas extraction channels 5 of the distribution body 1.

While the disclosure has been illustrated and described in detail in the drawings and foregoing description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A distribution body for distributing a process gas relative to a substrate to treat the substrate by means of the process gas, comprising:
   a distribution plate,
   at least one gas inlet channel,
   a plurality of gas distribution channels, and
   a plurality of gas extraction channels,
   wherein the gas inlet channel extends from a lateral surface of the distribution plate to an interior of the distribution plate,
   wherein the gas distribution channels branch off from the at least one gas inlet channel and extend to a substrate-facing surface of the distribution plate to supply process gas to the substrate to be treated, wherein the gas distribution channels are directed essentially perpendicular to the substrate-facing surface,
   wherein the gas extraction channels extend from the substrate-facing surface to another surface of the distribution plate to convey gas away from the substrate,
   wherein openings of the plurality of gas distribution channels have a diameter larger than a diameter of openings of the plurality of gas extraction channels, and
   wherein a summation of cross sections of all openings of the plurality of gas distribution channels in the substrate-facing surface is essentially equal to or smaller than a summation of cross sections of all openings of the plurality of gas extraction channels in the substrate-facing surface.

2. The distribution body according to claim 1, wherein a single opening of a gas distribution channel in the substrate-facing surface is surrounded by several openings of gas extraction channels arranged on an imaginary circular line around the opening of the gas distribution channel as imaginary circle centre.

3. The distribution body according to claim 1, wherein openings of the gas distribution channels and openings of the gas extraction channels are arranged on imaginary spiral curved lines around an imaginary centre.

4. The distribution body according to claim 1, further comprising at least one radiation unit arranged at the substrate-facing surface of the distribution plate to radiate the substrate to be treated.

5. The distribution body according to claim 1, wherein the radiation unit comprises at least one LED arranged between an opening of the gas distribution channels and an opening of the gas extraction channels.

6. The distribution body according to claim 5, wherein, in case of several LEDs, the LEDs are arranged on imaginary spiral curved lines around an imaginary centre.

7. The distribution body according to claim 1, wherein the LED is tuneable to provide radiation of different wavelengths and/or wherein, in case of several LEDs, the LEDs have different wavelengths.

8. The distribution body according to claim 1, further comprising a temperature control unit to heat or cool the gas and/or the substrate.

9. A deposition system for treating a substrate by a process gas, comprising:

a distribution body according to claim 1, and a substrate holder, wherein the substrate holder is configured to hold the substrate to be treated.

10. The deposition system according to claim 9, further comprising means to adjust a pressure in a processing space(s) between the distribution body and the substrate from 0.1 Torr to at least 900 Torr.

11. The deposition system according to claim 9, further comprising a substrate agitation unit, wherein the substrate agitation unit is configured to agitate and/or rotate the substrate holder relative to the distribution body.

12. The deposition system according to claim 9, further comprising a gas cycle unit, wherein the gas cycle unit is connected to the gas extraction channels and the at least one gas inlet channel of the distribution body.

13. The deposition system according to claim 9, further comprising a gas reconditioning system to provide the substrate with a gas flow of constant or controlled-varying composition or constant or controlled-varying temperature.

\* \* \* \* \*